United States Patent
Okita et al.

(10) Patent No.: US 10,361,111 B2
(45) Date of Patent: Jul. 23, 2019

(54) PLASMA PROCESSING APPARATUS AND PLASMA PROCESSING METHOD

(71) Applicant: Panasonic Intellectual Property Management Co., Ltd., Osaka (JP)

(72) Inventors: Shogo Okita, Osaka (JP); Takahiro Miyai, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/888,161

(22) Filed: Feb. 5, 2018

(65) Prior Publication Data

US 2018/0240697 A1    Aug. 23, 2018

(30) Foreign Application Priority Data

Feb. 17, 2017  (JP) .................. 2017-028453

(51) Int. Cl.
  *H01L 21/683*    (2006.01)
  *H01J 37/32*    (2006.01)
  (Continued)

(52) U.S. Cl.
  CPC .......... *H01L 21/6833* (2013.01); *H01J 37/00* (2013.01); *H01J 37/3244* (2013.01);
  (Continued)

(58) Field of Classification Search
  CPC ......... H01L 21/67259; H01L 21/67265; H01L 21/3065; H01L 21/6833; H01L 21/6831;
  (Continued)

(56) References Cited

U.S. PATENT DOCUMENTS

2001/0017205 A1   8/2001 Ikeda
2007/0217118 A1   9/2007 Ikuhara et al.
(Continued)

FOREIGN PATENT DOCUMENTS

JP   H10-240356 A   9/1998
JP   H11-087480 A   3/1999
(Continued)

OTHER PUBLICATIONS

Japanese Office Action issued in Japanese Patent Application No. JP2017-028453 dated Dec. 18, 2018.

*Primary Examiner* — Thanh Y. Tran

(74) *Attorney, Agent, or Firm* — Pearne & Gordon LLP

(57) ABSTRACT

Provided is a plasma processing apparatus which comprises a chamber, a stage configured to set a holding sheet and a substrate held thereon, a securing mechanism configured to secure the holding sheet on the stage, a plasma generator including a first electrode and a first high-frequency power supply, and a determiner for determining a contact status between the holding sheet and the stage, wherein a gas through-hole is arranged on a surface of the stage in an annular region defined between an inner edge of a frame set on the stage and an outer edge of the substrate, and wherein the determiner is configured to determine the contact status in accordance with a pressure of a gas in the gas introduction conduit and/or a regulation data for regulating the pressure of the gas, the gas being introduced between the stage and the holding sheet from the gas through-hole.

8 Claims, 12 Drawing Sheets

(51) Int. Cl.
*H01L 21/67* (2006.01)
*H01L 21/78* (2006.01)
*H01L 21/3065* (2006.01)
*H01L 21/66* (2006.01)
*H01J 37/00* (2006.01)
*H01L 21/687* (2006.01)

(52) U.S. Cl.
CPC .. *H01J 37/32715* (2013.01); *H01J 37/32816* (2013.01); *H01L 21/3065* (2013.01); *H01L 21/67069* (2013.01); *H01L 21/67109* (2013.01); *H01L 21/67253* (2013.01); *H01L 21/6831* (2013.01); *H01L 21/6835* (2013.01); *H01L 21/68735* (2013.01); *H01L 21/68742* (2013.01); *H01L 21/68785* (2013.01); *H01L 21/78* (2013.01); *H01L 22/20* (2013.01); *H01J 2237/24585* (2013.01); *H01J 2237/334* (2013.01); *H01L 21/67092* (2013.01); *H01L 2221/68327* (2013.01)

(58) Field of Classification Search
CPC ......... H01L 21/68785; H01L 21/68742; H01L 21/68735; H01J 37/3244; H01J 37/32715; H01J 37/32449
See application file for complete search history.

(56) References Cited

U.S. PATENT DOCUMENTS

| | | |
|---|---|---|
| 2010/0002354 A1 | 1/2010 | Inazumachi et al. |
| 2015/0340203 A1 | 11/2015 | Matsubara et al. |
| 2017/0271194 A1* | 9/2017 | Okita ................ H01L 21/68785 |

FOREIGN PATENT DOCUMENTS

| | | |
|---|---|---|
| JP | 2007-234869 A | 9/2007 |
| JP | 2008-042141 A | 2/2008 |
| JP | 2014-513868 A | 6/2014 |
| JP | 2015-225890 A | 12/2015 |
| WO | 2012/125560 A2 | 9/2012 |

\* cited by examiner

Gas Flow Rate

Gas Pressure

Prescribed Value

Valve Opening

100%

Prescribed Value

Monitoring Time

Prescribed Time

PLASMA PROCESSING APPARATUS AND PLASMA PROCESSING METHOD

CROSS REFERENCE TO RELATED APPLICATION

The present application is based on and claims priority under 35 U.S.C. § 119 with respect to the Japanese Patent Application No. 2017-028453 filed on Feb. 17, 2017 of which entire content is incorporated herein by reference into the present application.

TECHNICAL FIELD

The present invention relates to an apparatus and a method for plasma processing a substrate held on a holding sheet.

BACKGROUND

One of processes for dicing the substrate is known as a plasma dicing process which achieves a plasma-etching for the substrate with a mask thereon so as to divide it into a plurality of individual chips. Patent Document 1 (JP 2014-513868, A or U.S. Pat. No. 8,802,545 B2) discloses the plasma processing process for the substrate, in which the substrate is held on a conveying carrier that includes a frame and a holding sheet covering an aperture of the frame, and the substrate is set on a stage provided within a plasma processing apparatus, for ease of the handling of the substrate during delivery thereof.

The holding sheet is thin and easy to be bent so that the conveying carrier holding the substrate may be set on the stage with the holding sheet being crimped. When the plasma treatment is implemented with the holding sheet being crimped, the crimped portion may be exposed to an irregular discharge and/or intensive heat so that it may be difficult to achieve the plasma treatment in an appropriate or expected manner.

Many of electrical apparatuses have recently been smaller and thinner, and IC chips incorporated in such electrical apparatuses have also been thinner. Eventually, the substrate to be diced for producing the IC chips are also has been easier to be bent as well as the holding sheet. When such an easily warping substrate is adhered and held on the holding sheet, the crimps on the holding sheet tend to cause crimps on the substrate. Also, even slight distortion on the frame may more likely cause crimps on the holding sheet and the substrate.

The plasma treatment is carried out while the conveying carrier is set and contacted on the stage by an electrostatic chucking mechanism called as an electrostatic chuck. The electrostatic chucking mechanism pulls or sticks the holding sheet onto the stage by means of the coulomb force or Johnson-Rahbek force between the Electrostatic Chuck electrode (referred to as ESC electrode) provided within the stage and the holding sheet, upon application of voltage with the ESC electrode. In this situation, the holding sheet that holds the substrate may be pulled or stuck on the stage with the crimp thereon. The crimp on the holding sheet raises a portion of the holding sheet which should be pulled evenly onto the stage. This causes an insufficient contact between the substrate through the sheet and the stage.

The insufficient contact between the substrate through the sheet and the stage distorts the configuration of a plasma sheath generated at an interfacial surface between the substrate being plasma processed and a plasma atmosphere, so that the substrate may be etched unevenly, causing a variation of the processed shape and even non-processed portion of the substrate. Also, the insufficient contact may generate an intensive heat and/or an inappropriate discharge on a local point on the substrate. Such an intensive heat and/or an inappropriate discharge may damage the substrate, the holding sheet, and even the ESC electrode, which eventually cause a poor productivity.

SUMMARY

One aspect of the present invention relates to a plasma processing apparatus, which comprises a chamber, a stage provided inside the chamber and configured to set a holding sheet and a substrate held thereon, the holding sheet having a circumference secured on a frame, a securing mechanism configured to secure the holding sheet on the stage, a plasma generator including a first electrode and a first high-frequency power supply for supplying a high-frequency power to the first electrode, and a determiner for determining a contact status between the holding sheet and the stage, wherein a gas through-hole connected to a gas introduction conduit is arranged on a surface of the stage in an annular region defined between an inner edge of the frame set on the stage and an outer edge of the substrate, and wherein the determiner is configured to determine the contact status in accordance with at least one of a pressure of a gas in the gas introduction conduit and a regulation data for regulating the pressure of the gas in the gas introduction conduit, the gas being introduced between the stage and the holding sheet from the gas through-hole through the gas introduction conduit.

Another aspect of the present invention relates to a plasma processing method, which comprises a setting step for setting a holding sheet on a stage provided in a plasma processing apparatus, the holding sheet having a circumference secured on a frame, a securing step for securing the holding sheet on the stage, a determining step for determining a contact status between the holding sheet and the stage, and a plasma etching step for etching the substrate on the stage by exposing a surface of the substrate to a plasma atmosphere upon determining the contact status as being acceptable, wherein a gas through-hole connected to a gas introduction conduit is arranged on a surface of the stage in an annular region defined between an inner edge of the frame set on the stage and an outer edge of the substrate, and wherein in the determining step, a gas is introduced between the stage and the holding sheet from the gas through-hole through the gas introduction conduit, and the contact status is determined in accordance with at least one of a pressure of the gas in the gas introduction conduit and a regulation data for regulating the pressure of the gas in the gas introduction conduit.

DETAILED DESCRIPTION

[Plasma Processing Apparatus] A plasma processing apparatus according to the present embodiment includes a chamber, a stage provided inside the chamber and configured to set a holding sheet and a substrate held thereon, the holding sheet having a circumference secured on a frame, a securing mechanism configured to secure the holding sheet on the stage, a plasma generator provided outside the chamber, the plasma generator including a first electrode and a first high-frequency power supply for supplying a high-frequency power to the first electrode, and a determiner for determining a contact status between the holding sheet and the stage.

Figure 1A:
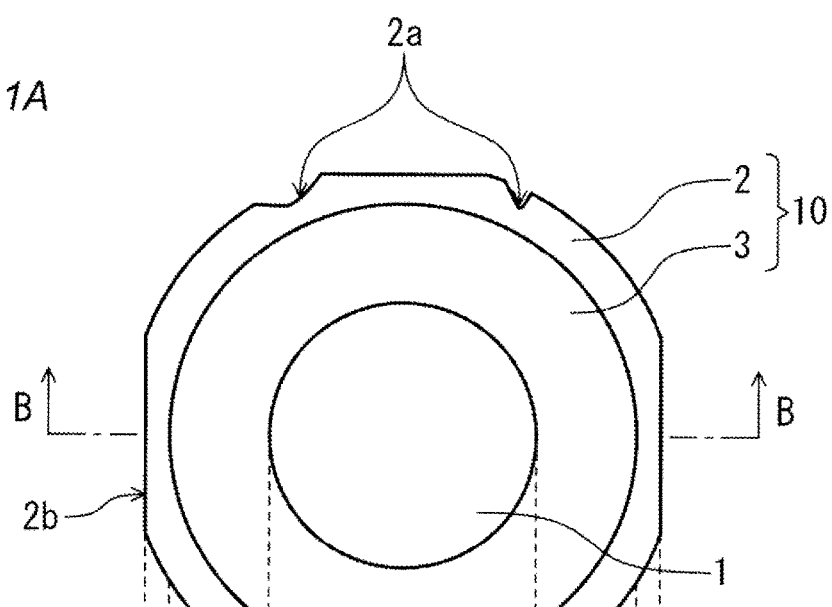
FIG. 1A is a top plan view schematically depicting a conveying carrier holding a substrate according to an embodiment of the present invention.
Figure 1B:
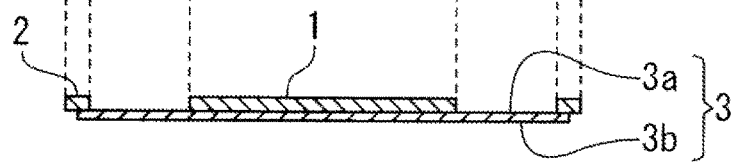
FIG. 1B is a cross-sectional view taken along a B-B line of FIG. 1A.

Firstly, referring to FIGS. 1A and 1B, one embodiment of the holding sheet that holds the substrate and the frame securing the circumference of the holding sheet will be described herein. The frame and the holding sheet may collectively be referred as a conveying carrier hereinafter. FIG. 1A is a top plan view schematically depicting the substrate 1 and the conveying carrier 10, and FIG. 1B is a cross-sectional view taken along a B-B line. As illustrated in FIG. 1A, the conveying carrier 10 includes the frame 2 and the holding sheet 3. The circumference of the holding sheet 3 is secured by the frame 2. The substrate 1 is adhered on the holding sheet 3 so as to be held on the conveying carrier 10. It should be noted that although FIG. 1 depicts the frame 2 and the substrate 1 as being substantially circular, the shapes thereof are not limited thereto. In the illustrated example, similar components having similar functions are denoted with the same reference numerals.

[Substrate] The substrate 1 is an object of the plasma treatment. The substrate 1 is obtained, for example, by forming on one side of the main body, a circuit layer containing semiconductor circuits, electrical component elements, and MEMSs, and then grinding the other side of the main body opposite the circuit layer to make it thinner. The semiconductor 1 is individualized or diced into a plurality of electronic components including the circuit layer (not shown).

The size of the substrate 1 is not limited to a particular one, and the maximum diameter thereof may be in a range about between 50 nm and 300 nm. The thickness of the substrate 1 is rather thin, typically about between 25 μm and 150 μm. Thus, the substrate 1 itself has little rigidity (self-support capability). The circumference of the holding sheet 3 is secured on the substantially flat frame 2, and the substrate 1 is adhered on the frame 2. This makes easier to handle the substrate 1, for example, to transfer or deliver the substrate between subsequent operation steps. The shape of the substrate 1 is not limited to a particular one, and may be, for example, circular or rectangular. The substrate 1 may be provided with an orientation flat and/or a notch (not shown).

The material of the main body of the substrate 1 is not limited to a particular one, and may be, for example, semiconductor, dielectric, metal, or stacked layer of a combination thereof. The semiconductor material may contain, for example, silicon (Si), gallium arsenide (GaAs), gallium nitride (GaN), or silicon carbide (SiC). The dielectric layer may be made of, for example, resin such as polyimide, low-dielectric (low-k) material, silicon dioxide ($SiO_2$), silicon nitride ($Si_3N_4$), lithium tantalate ($LiTaO_3$), or lithium niobate ($LiNbO_3$).

The substrate 1 has a mask (not shown) having a predetermined pattern on one side (top side) opposite the other side (bottom side) on which the holding sheet 3 is adhered. The masked regions of the substrate 1 are protected from being etched by plasma exposure. The uncovered regions of the substrate 1 may be etched from the top side to the bottom side by plasma exposure. The mask may be a resist mask which is formed by exposing and developing a resist layer. Also, the mask may be formed by laser scribing either one of a dielectric layer such as silicon dioxide ($SiO_2$) and silicon nitride ($Si_3N_4$) laminated on the top side of the substrate 1, a resin layer containing polyimide, polybenzoxazole (PBO), and a resin film, to make the predetermined pattern (apertures) thereon.

[Frame] The frame 2 is provided with an opening which has an area equal to or greater than that of the whole substrate 1, a predetermined width, and a substantially constant and small thickness. The frame 2 has a rigidity such that it can be transferred or delivered with the holding sheet 3 and the substrate 1 adhered thereon.

The shape of the opening of the frame 2 is not limited to a particular one, and may be, for example, circular, rectangular, and polygonal such as hexagonal. The frame 2 may be provided with a notch 2a and/or a corner cut 2b for alignment thereof. The frame 2 may be formed of material including, for example, metal such as aluminum and stainless steel, or a resin. The bottom side of the frame 2 is adhered on the top side of the holding sheet 3 at the circumference thereof.

[Holding Sheet] The holding sheet 3 includes an adhesive side 3a having an adhesive compound and a non-adhesive side 3b having no adhesive compound. The adhesive side 3a has the circumference adhered on the bottom side of the frame 2, and covers the opening of the frame 2. The substrate 1 is adhered on the adhesive side 3a of the holding sheet 3 in the opening of the frame 2.

The adhesive side 3a may preferably contain an adhesive material of which adhesibility is weakened with an ultraviolet beam (UV-radiation). This allows each of individualized substrate (electric components) or element chips obtained by the plasma dicing step to easily be peeled off and picked up from the adhesive side 3a through the UV-radiation. The holding sheet 3 may be formed, for example, by applying an UV-curing acrylic adhesive on one side of a film-shaped backing member to have a thickness of 5-20 µm.

The material of the film-shaped backing member is not limited to a particular one, and may be a thermoplastic resin including, for example, polyolefin such as polyethylene and polypropylene and polyester such as polyethylene terephthalate. The backing member may contain various additives including, for example, a rubber component for adding stretching property (for example, ethylene-propylene rubber (EPM), ethylene-propylene-diene rubber (EPDM)), a plasticizer, a softener, an antioxidant, and a conductive material. Furthermore, the thermoplastic resin may contain a functional group showing a photopolymerization reaction such as an acryl group. The backing member may have a thickness, for example, between 50-150 µm. The conveying carrier 10 is set on the stage 111 so that the non-adhesive side 3b of the holding sheet 3 is in contact with the stage 111.

[Fundamental Structure of Plasma Processing Apparatus]

Figure 2:
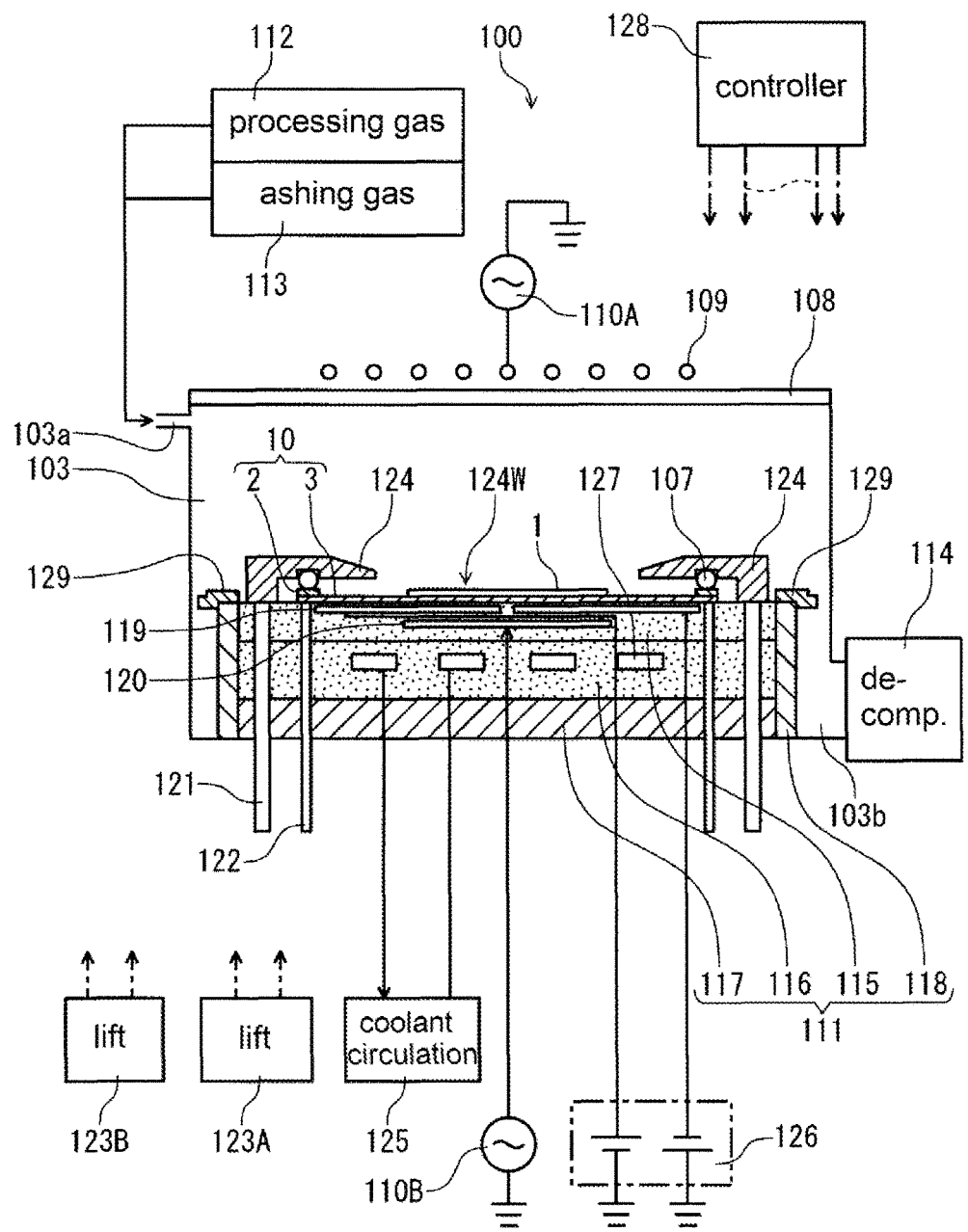
FIG. 2 is a conceptual cross-sectional view depicting a basic structure of a plasma processing apparatus according to the embodiment of the present invention.

Next, referring to FIG. 2, a fundamental structure of the plasma processing apparatus 100 according to the embodiment of the present invention will be described in detail hereinafter. FIG. 2 depicts a schematic structure in a cross section of the fundamental structure of the plasma processing apparatus 100. The plasma processing apparatus 100 includes a stage 111, on which the conveying carrier 20 is set so that the adhesive side adhering the substrate 1 faces upwardly. The stage 111 has such a size that the whole conveying carrier 10 can be seated thereon. Arranged over the stage 111 is a cover 124 which covers at least a portion of the frame 2 and the holding sheet 3 and includes a window 124W (which may be referred to as a third window) exposing at least a portion of the substrate 10. The cover 124 is provided with a biasing member 107 for biasing the frame 2 downward when the frame 2 is set on the stage 111. The biasing member 107 may preferably be a component for achieving a point contact with the frame 2 such as a coil spring and an elastic resin. This restricts a thermal communication between the frame 2 and the cover 124, and also allows correcting a distortion of the frame 2.

The stage 111 and the cover 124 are received within a reaction chamber (vacuum chamber) 103. The vacuum chamber 103 is shaped in a substantially cylindrical configuration having an opening at the top thereof, and the top opening is closed by a dielectric member 208 formed as a lid of the vacuum chamber 103. The vacuum chamber 103 may be formed of aluminum, stainless steel (SUS), or aluminum with anodic oxide coating, for example. The dielectric member 108 may be formed of yttrium oxide ($Y_2O_3$), aluminum nitride (AlN), alumina ($Al_2O_3$), or quartz ($SiO_2$), for example. Arranged on or above the dielectric member 108 is a top or first electrode 109. The first electrode 109 is electrically connected to a first high-frequency power source 110A. The stage 111 is positioned at the bottom side in the vacuum chamber 103.

The vacuum chamber 103 is provided with a gas inlet 103a for introducing a gas and a gas outlet 103b for exhausting the gas. The inlet 103a is configured to be connected selectively to one of a material gas source (a processing gas source) 112 and an ashing gas source 113 each through a conduit. The outlet 103b is connected to a decompressing mechanism 114 having a vacuum pump for exhausting a gas within the vacuum chamber 103 and decompressing it. While the vacuum chamber 103 is supplied with the processing gas, the first electrode 109 is applied with a high-frequency power from the first power source 110A so as to generate the plasma atmosphere within the chamber 103.

The stage 111 includes an electrode layer 115, a metal layer 116, and a base member 117 supporting the electrode layer 115 and the metal layer 116, each having a substantially circular shape. The stage 111 also includes a peripheral member 118 surrounding the electrode layer 115, the metal layer 116, and the base member 117. The peripheral member 118 is formed of a metal having a conductivity and an etching resistance for protecting the electrode layer 115, the metal layer 116, and the base member 117 from the plasma exposure. Provided on an upper surface of the peripheral member 118 is an annular circumferential ring 129 for protecting it from the plasma exposure. The electrode layer 115 and the circumferential ring 129 may be formed of the dielectric material as listed above.

Arranged within the electrode layer 115 are a first or electrostatic chuck (ESC) electrode 119 and a second electrode 120 connected to a second high-frequency power source 110B. The ESC electrode 119 is electrically connected to a DC power source 126. The electrostatic chucking mechanism is composed of the ESC electrode 119 and the DC power source 126. The holding sheet 3 is pulled on and secured to the stage 111 by means of the electrostatic chucking mechanism. Although this embodiment describes the electrostatic chucking mechanism as an example of the securing mechanism for securing the holding sheet 3 to the stage 111, the securing mechanism is not limited thereto. Alternatively, the securing mechanism for securing the holding sheet 3 to the stage 111 may be performed by a clamp (not shown). The electrostatic chucking mechanism will be described in detail hereinafter.

The metal layer 116 may be formed of aluminum with an anodic oxidation coating, for example. The metal layer 116 contains a coolant channel 127 configured to cool the stage 111. Cooling the stage 111 causes the holding sheet 3 seated on the stage 111 to be cooled down. Also, the cover 124 whose portion contacts with the stage 111 is also cooled down. This protects the substrate 1 and the holding sheet 3 from being damaged due to heat applied during the plasma processing step. A coolant in the coolant channel 127 is circulated by a coolant circulation apparatus 125.

Provided around the peripheral portion of the stage 111 is a plurality of supporting members 122 extending therethrough. Each of the supporting members 122 supports the frame 2. The supporting members 122 are driven by a lifting mechanism 123A to move upward and downward. The conveying carrier 10 is delivered into the vacuum chamber 103, and set on the supporting members 122 raised at a given level. Then the supporting members 122 are lowered with the top surface being flush with or lower than the stage 111, which sets the conveying carrier 10 on the stage 111 at a predetermined position thereof.

Also, a plurality of lifting rods 121 are coupled to the peripheral edge of the cover 124 for moving it upward and downward. The lifting rods 121 are driven by another lifting mechanism 123B. The operation of the lifting mechanisms 123A, 123B are controlled independently each other.

The controller 128 is adapted to control operations of the plasma processing apparatus 200 which includes the first high-frequency power source 110A, the second high-frequency power source 110B, the processing gas source 112, the ashing gas source 113, the decompressing mechanism 114, the coolant circulation apparatus 125, the lifting mechanisms 123A, 123B, and the electrostatic chucking mechanism.

Figure 3:
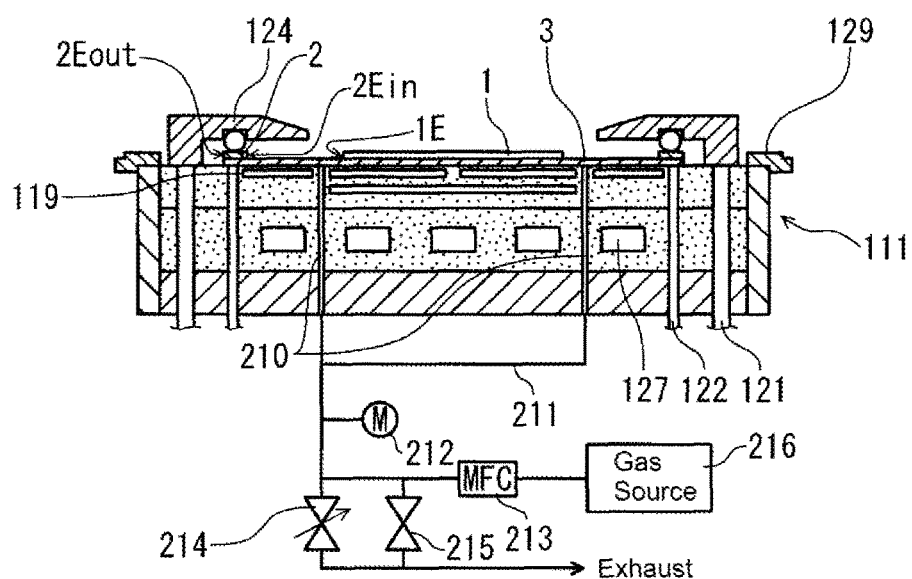
FIG. 3 is a conceptual cross-sectional view depicting a main section of the plasma processing apparatus according to the embodiment of the present invention.
Figure 4:
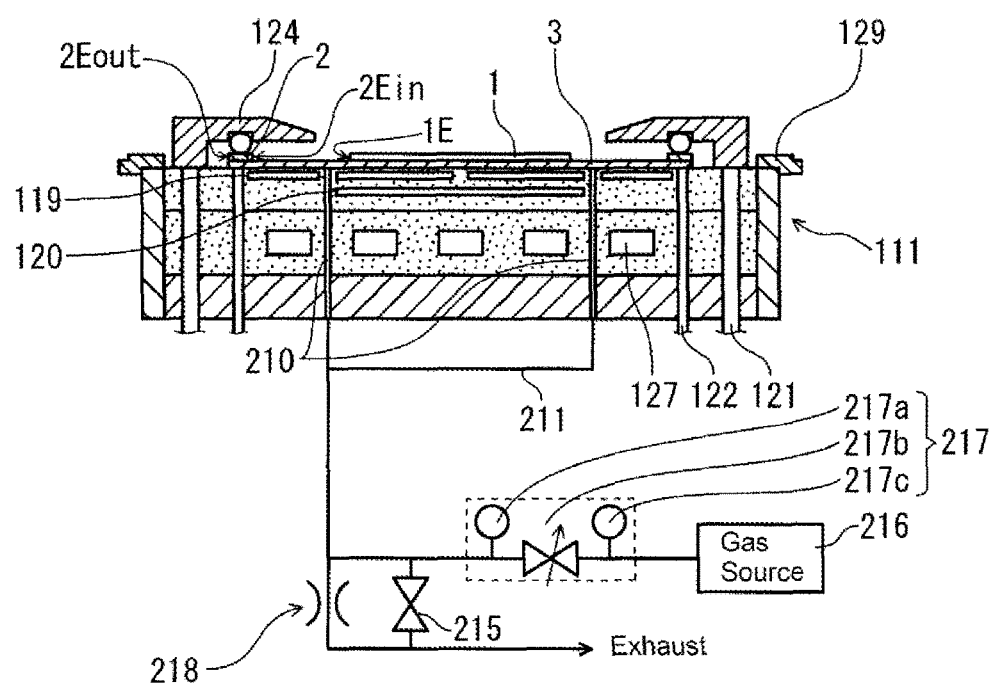
FIG. 4 is a conceptual cross-sectional view depicting another main section of the plasma processing apparatus according to an embodiment of the present invention.
Figure 5:
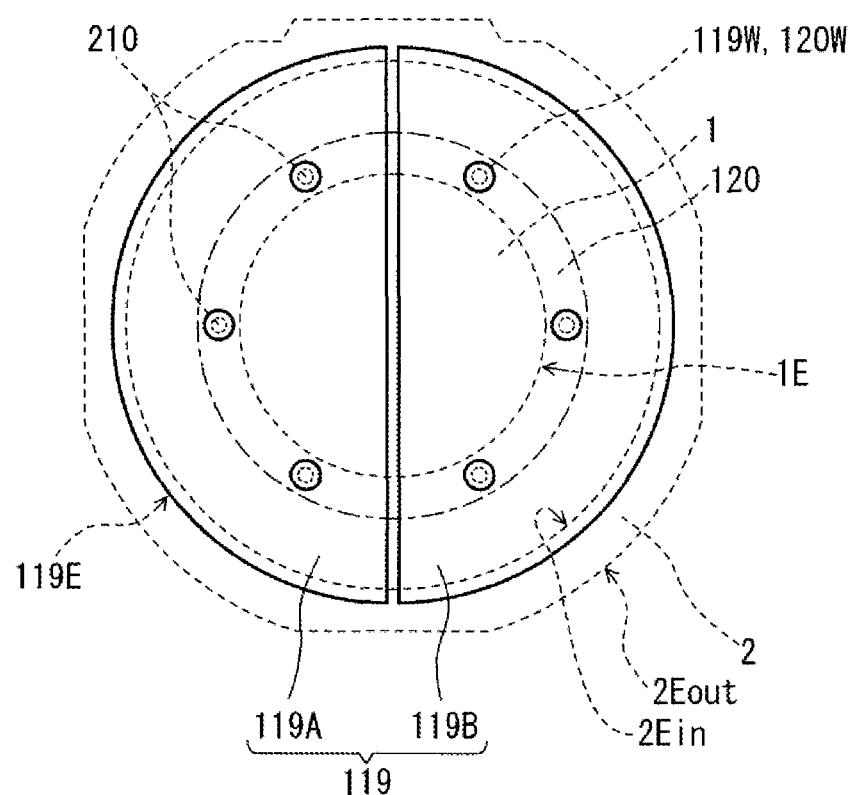
FIG. 5 is a top plan view depicting an arrangement of gas through-holes used for determination.
Figure 6:
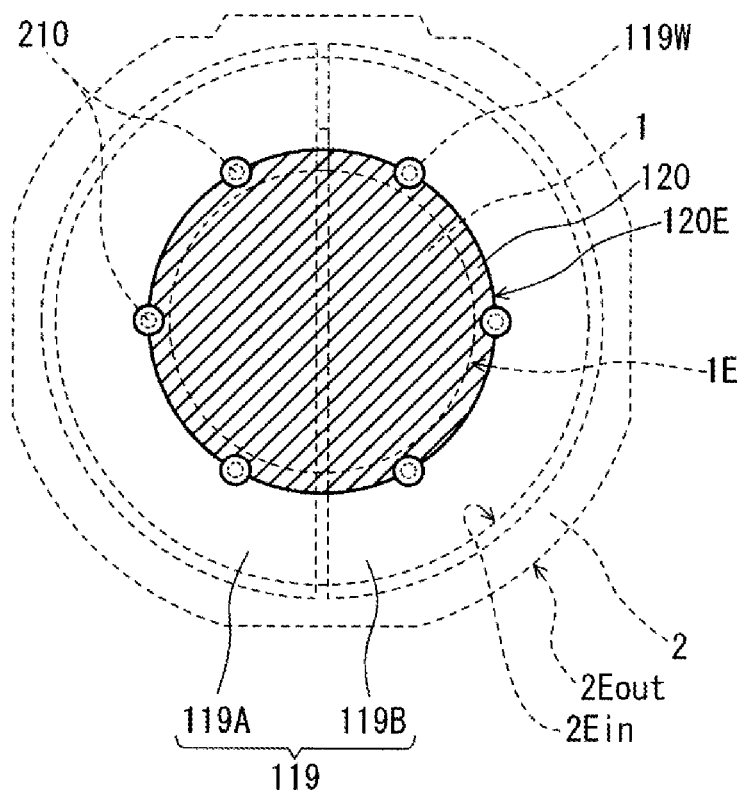
FIG. 6 is a top plan view depicting another arrangement of gas through-holes used for determination.

[Plasma Processing Apparatus of Present Embodiment] Next, referring to FIGS. 3-6, the plasma processing apparatus 100 according to the present embodiment will be described in detail hereinafter. FIGS. 3 and 4 are conceptual cross-sectional views depicting a main section of the plasma processing apparatus 100 according to the present embodiment. FIGS. 5 and 6 are top plan view depicting an arrangement of gas through-holes 210 used for determining the contact status between the holding sheet 3 and the stage 111. FIG. 6 depicts the second electrode 120 conveniently with a hatching.

As illustrated in FIG. 3, the plasma processing apparatus 100 includes several gas through-holes 210 on the top surface of the stage 111, each of which is connected to a gas introduction conduit 211, and a controller or a determiner (not shown) for determining if the holding sheet 3 surely contacts with the stage 111. The gas through-holes 210 are used for introducing the gas between the stage 111 and the holding sheet 3. The determiner is adapted to receive a pressure of the gas between the stage 111 and the holding sheet 3 that is equivalent to the pressure of the gas in the gas introduction conduit 211 (or a regulating data thereof), which is introduced from the gas through-holes 210, and to determine how the holding sheet 3 contacts with the stage 111. Thus, the contact status between the stage 111 and the holding sheet 3 reflects the contact status between the stage 111 and the substrate 1 through the holding sheet 3.

[Gas Through-holes for Determiner] The gas through-holes 210 are connected to the gas introduction conduit 211. Also connected to the gas introduction conduit 211 are a manometer 212 for measuring the pressure of the gas in the gas introduction conduit 211, a mass flow controller (MFC) 213 for adjusting a mass flow of the gas, a pressure regulating valve 214 for regulating the pressure of the gas that is used for determination of the contact status, a bypass valve 215 for exhausting the gas, and a gas source 216 used for determination of the contact status. In case that a plurality of the gas through-holes 210 are provided, the gas introduction conduit 211 may be bifurcated into a plurality of sub-conduits connected to each of the gas through-holes 210. The gas from the gas source 216 is regulated at a predetermined flow rate and supplied to the gas introduction conduit 211. The valve opening of the pressure regulating valve 214 is controlled in accordance with the gas pressure in the gas introduction conduit 211 measured by the manometer 212 so that the gas pressure in the gas introduction conduit 211 is regulated at a predetermined pressure. The gas in the gas introduction conduit 211 can be evacuated by opening the bypass valve 215.

The holding sheet 3 may possibly be set on the stage 111 with crimps thereon. Yet, such crimps on the holding sheet 3 may possibly be stretched upon electrostatically chucking the holding sheet 3. However, if the electrostatic chuck force is insufficient and/or if the crimp is too extensive to be removed, the crimps may remain even after electrostatically chucking the holding sheet 3. In this case, a gap is formed between the holding sheet 3 and the top surface of the stage 111 at a region where the crimp remains. Thus, the holding sheet 3 is not in close contact with the surface of the stage 111, so that the holding sheet 3 fails to cover the gas through-holes 210. On the other hand, the holding sheet 3 is in close contact with the surface of the stage 111 where no crimp remains so that the holding sheet 3 fully covers the gas through-holes 210. In other words, the crimp on the holding sheet 3 gives an impact on how the holding sheet 3 covers the gas through-holes 210. The determiner of the present embodiment determines the contact status between the holding sheet 3 and the stage 111 in accordance with the situation of the gas (e.g., the gas pressure or the regulation data for regulating the gas pressure) supplied to the gas through-holes 210. For example, the gas pressure or the regulation data for regulating the gas pressure may include the opening of the pressure regulating valve 214, the mass flow of the gas adjusted by the MFC 213, and a time duration for supplying the gas to the gas introduction conduit 211.

For example, with the configuration as depicted in FIG. 3, the contact status between the holding sheet 3 and the stage 111 can be determined by monitoring the opening of the pressure regulating valve 214 while the pressure regulating valve 214 regulates the gas pressure in the gas introduction conduit 211 at a given pressure.

The system for determining the contact status is not limited thereto, and for example, as depicted in FIG. 4, an automatic pressure regulator 217 may be used to determine the contact status in accordance with the mass flow of the gas. The automatic pressure regulator 217 includes a manometer 217a, a piezo-valve 217b and a flowmeter 217c. The automatic pressure regulator 217 is also configured to automatically adjusts the opening of the piezo-valve 217b so that the pressure detected by the manometer 217a is kept at a predetermined pressure, and outputs the mass flow of the gas of the flowmeter 217c or the signal thereof.

In the aforementioned system, the gas introduction conduit 211 connected to gas through-holes 210 is also connected to the automatic pressure regulator 217 for regulating the gas pressure, an orifice 218 for guiding a portion of the gas in the introduction conduit 211 to the exhaust, the bypass valve 215 for exhausting the gas, and the gas source 216 used for determination of the contact status. In case that a plurality of the gas through-holes 210 are provided, the gas introduction conduit 211 may be bifurcated into a plurality of sub-conduits connected to each of the gas through-holes 210. The gas from the gas source 216 is regulated at a predetermined pressure by the automatic pressure regulator 217, and supplied to the gas introduction conduit 211. The automatic pressure regulator 217 controls the valve opening of the piezo-valve 217b based upon the gas pressure detected by the manometer 217a, and outputs the mass flow of the gas measured by the flowmeter 217c. Thus, by means of this system, the contact status between the holding sheet 3 and the stage 111 can be determined by monitoring the mass flow of the gas, while the automatic pressure regulator 217 regulates the gas pressure in the gas introduction conduit 211.

FIGS. 5 and 6 are top plan views depicting an arrangement of gas through-holes used for determination, illustrating the frame 2 seated on the stage 111 having an inner edge 2Ein and an outer edge 2Eout and the substrate 1 having an outer edge. As illustrated in FIGS. 5 and 6, the gas through-holes 210 are arranged in an annular region defined between the inner edge 2Ein of the frame 2 and the outer edge 1E of the substrate 1. Preferably, the gas through-holes 210 may be arranged closer to the outer edge of the substrate 1 to improve an accuracy of determination. Thus, the minimal gap between an outer edge of the gas through-hole 210 and the outer edge of the substrate 1 is shorter than the minimal gap between the outer edge of the gas through-hole 210 and the inner edge 2Ein of the frame 2. The minimal gap between the outer edge of the gas through-hole 210 and the outer edge of the substrate 1 may preferably be in a range between 0-6 mm.

When the gas through-holes 210 are arranged away from (or not beneath) the substrate 1, the contact status between the substrate 1 and the stage 111 can be precisely determined. The reason will be described herein. The crimps on the holding sheet 3 are caused by sags thereof. The circumference of the holding sheet 3 are secured on the frame 2, which gives an adequate tension thereto. Thus, the crimps on the holding sheet 3 often extend from a region close to the frame 2, across the annular region where the substrate 1 is not held on the holding sheet 3, to a region where substrate 1 is held on the holding sheet 3. Thus, most of the crimps on the holding sheet 3 caused by the sags thereof extend across the annular region where the substrate 1 is not held on the holding sheet 3. Therefore, the contact status of the substrate 1 can be determined by arranging the gas through-holes 210 in the annular region defined between the inner edge 2Ein of the frame 2 and the outer edge 1E of the substrate 1.

As above, the gas through-holes 210 arranged away from (or not beneath) the substrate 1 allows determining the contact status between the stage 111 and the substrate 1 through the holding sheet 3 without an adverse effect on circuit layers formed in the element regions on the substrate 1. Also, the gas through-holes 210 minimizes another adverse effect in the next plasma dicing step, preventing the substrate 1 from being plasma etched in a local or uneven manner. In the plasma dicing step for dividing or individualizing the substrate 1 into a plurality of element chips particular by means of the plasma exposure, since the substrate 1 held on the stage with the holding sheet 3 therebetween is plasma-etched deep until the surface of the holding sheet 3 is exposed, the gas through-holes 210 tend to give a substantial impact on the plasma dicing. As the substrate 1 is thinner, the impact due to the gas through-holes 210 is greater.

A plurality of the gas through-holes 210 are arranged in the annular region and spaced circumferentially by a predetermined gap which may be in a range between 20-100 mm, for example. In particular, the gas through-holes 210 may preferably be formed in the stage 111 by the gap of about 50 mm when taking consideration of production cost of the stage 111 provided with the gas through-holes 210. The number of the gas through-holes 210 may be designed appropriately in accordance with the size of the substrate 1. For example, when the substrate 1 has a diameter of 200 mm, twelve of the gas through-holes 210 may be arranged, and when the substrate 1 has a diameter of 300 mm, sixteen of the gas through-holes 210 may be formed. The gas through-holes 210 may preferably be spaced circumferentially by a predetermined gap. This arrangement allows determining the contact status across substantially whole surface of the substrate 1.

The shape of the gas through-holes 210 is not limited to a particular one, and may be circular, oval, or polygonal (such as rectangular and hexagonal). The size of the gas through-holes 210 is not limited to a particular one, and may correspond to a circle preferably having a diameter of 0.3-1.0 mm, and more preferably 0.5-0.8 mm.

Any types of the gas for determination may be used, which give no influence on the plasma etching. The gas for determination may be, for example, helium, argon, or nitrogen. Also, the gas pressure supplied from the gas through-holes 210 is not limited to a particular value, which preferably causes no warp on the holding sheet 3.

[Electrostatic Chucking Mechanism] In the electrostatic chucking mechanism, the ESC electrode 119 provided within the stage 111 is supplied with the power to generate a sticking force between the holding sheet 3 of the conveying carrier 10 and the stage 111, thereby to secure the substrate 1 and the holding sheet 3 on the stage 111. The ESC electrode 119 is preferably positioned in a region at least corresponding to the substrate 1 to stably secure the whole substrate 1. In the present embodiment, the substrate 1 is individualized or diced into a plurality of electrical components in the plasma etching step. To achieve a uniform etching, each of the electrical components in process is preferably plasma etched while being secured on the stage 111. Therefore, the whole substrate 1 is preferably stuck on the stage 111, and the ESC electrode 119 is preferably positioned in the region at least corresponding to the substrate 1.

The ESC electrode 119 can be categorized into two types, that is, a monopolar type and a bipolar type. The monopolar ESC electrode 119 includes at least one electrode. When the monopolar ESC electrode 119 includes two or more electrodes, those electrodes are applied with a voltage or potential each having the same polar character. The electrostatic chucking mechanism incorporating the monopolar ESC electrode 119 uses the coulomb force as a sticking mechanism. While the holding sheet 3 set on the stage 111 is negatively charged by the plasma atmosphere, the monopolar ESC electrode 119 is applied with a positive voltage. Due to the potential difference between the ESC electrode 119 and the charged holding sheet 3, the coulomb force is effected therebetween so that the conveying carrier 10 is stuck or secured on the stage 111. To charge the holding sheet, the plasma atmosphere is generated within the chamber 103 and the holding sheet 3 is exposed in the plasma atmosphere.

For the monopolar ESC electrode 119, the ESC electrode 119 may have the size equal to or greater than the size of the substrate 1 so as to arrange the ESC electrode 119 in the region corresponding at least to the substrate 1. Thus, the size of the ESC electrode 119 is preferably equal to or greater than the substrate 1, and more preferably greater than the substrate 1. The outer edge 119E of the ESC electrode 119 is preferably positioned in a region corresponding to one between the outer edge 2Eout of the frame 2 set on the stage 111 and the outer edge 1E of the substrate 1. When the outer edge 119E of the ESC electrode 119 is positioned outside of the outer edge 2Eout of the frame 2 (or in the outside region), a portion of the stage 111 in the outside region corresponding to the ESC electrode 119 is exposed directly with the plasma atmosphere entering into a space between the cover 124 and the stage 111, resulting in an insulation breakdown. This insulation breakdown may cause the ESC electrode 119 damaged.

Also, the outer edge 119E of the ESC electrode 119 is preferably positioned in a region corresponding to one between the outer edge 2Eout of the frame 2 set on the stage 111 and the inner edge 2Ein thereof. This facilitates the conveying carrier 10 to reliably be stuck on the stage 111.

In this case, the ESC electrode 119 is provided with a plurality of first windows 119W at positions corresponding to the gas through-holes 210 as illustrated in FIGS. 5 and 6. Preferably the size of each of the first windows 119W is small but substantial enough to uncover the gas through-hole 210, thereby to stably hold the substrate 1 on the ESC electrode 119. On the other hand, it is also preferable that the size of each of the first windows 119W is large but modest enough to ensure the electrical insulation between the second electrode 120 and the ESC electrode 119 arranged close thereto, thereby to prevent insulation breakdown therebetween. Thus, the size of each of the first windows 119W is such that they extend outside almost to the diameter of the circle depicted by an imaginary line which is spaced away from the outer edge of the first windows 119W by about 2-6 mm.

In order to achieve a uniformity of the plasma treatment for the substrate 1, each of the first windows 119W is preferably arranged not to overlap the substrate 1. On the other hand, the gas through-holes 210 are preferably arranged close to the outer edge 1E of the substrate 1. Thus, it is preferable that each of the first windows 119W is arranged not to overlap the substrate 1 but as close thereto as possible. For example, each of the first windows 119W extends inside almost to the outer edge 1E of the substrate 1 which spaced away from it by about 0.8-1.2 mm.

The monopolar ESC electrode 119 has an outline similar to that of the substrate 1. When the substrate 1 is shaped of a circle, preferably the monopolar ESC electrode 119 is also shaped of a circle. This allows the whole substrate to be electrostatically chucked in a uniform manner by the electrostatic chucking mechanism. Also, the first windows 119W each have an outline similar to that of the gas through-holes 210, for example.

The bipolar ESC electrode 119 includes positive and negative terminals which are applied with positive voltage (V1) and negative voltage (−V1) by the DC power source 126, respectively.

The electrostatic chucking mechanisms incorporating the bipolar ESC electrode 119 are categorized into two types, one using the coulomb force and the other using the Johnson-Rahbek force. The structure and material forming the bipolar ESC electrode 119 may be selected appropriately based upon the electrostatic chucking mechanism, and the material thereof may be, for example, ceramics such as fired ceramics and sprayed ceramics, resin such as polyimide, metal, and a laminate thereof. In each type of the electrostatic chucking mechanisms, the positive and negative terminals are applied with the positive and negative voltages so as to generate the sticking force between the ESC electrode 119 and the holding sheet 3, sticking the conveying carrier 10 on the stage 111. However, the electrostatic chucking mechanisms incorporating the bipolar ESC electrode does not require the holding sheet to be charged, unlike one using the monopolar ESC electrode.

The bipolar ESC electrode may be used as the monopolar ESC electrode by selecting the voltage applied to two of the terminals thereof. More specifically, two of the terminals are applied with the same polar voltage so that the bipolar ESC electrode can be used as the monopolar ESC electrode. In this disclosure, the term "bipolar mode" is used to refer the mode where two of the terminals of the bipolar ESC electrode are applied with the positive and negative voltages, and the term "monopolar mode" is used to refer the mode where the two of the terminals of the bipolar ESC electrode are applied with the same voltage.

In the monopolar mode, two of the terminals are applied with the same polar voltage to use the electrostatic chucking mechanism relying on the coulomb force. Unlike the bipolar mode, the conveying carrier 10 cannot be secured on the stage 111 just by applying the voltage to two of the terminals. To secure the conveying carrier 10 on the stage 111, the holding sheet 3 has to be electrically charged. Thus, the holding sheet 3 is negatively charged by exposing it to the plasma atmosphere, and the ESC electrode 119 is applied to the positive voltage. This generates a potential difference creating the coulomb force between the ESC electrode 119 and the holding sheet 3, thereby sticking the conveying carrier 10 on the stage 111. To charge the holding sheet 3, the plasma atmosphere P1 is generated within the chamber 103 for exposing the holding sheet 3 thereto. This causes the conveying carrier 10 stuck on the stage 111.

Although the monopolar and bipolar ESC electrode 119 are described above, either one of those can make the conveying carrier 10 stuck on the stage 111. Preferably, the bipolar ESC electrode 119 may be used in the bipolar mode to hold the conveying carrier 10 on the stage 111 prior to excitation of the plasma discharge, and after excitation of the plasma discharge, the bipolar mode is switched to the monopolar mode so that the conveying carrier 10 is stuck on the stage 111. Therefore, the plasma treatment is performed while the same voltage is applied across the whole conveying carrier 10 for electrostatically chucking it on the stage 111, which enhances the plasma treatment in view of a surficial uniformity.

The bipolar ESC electrode 119 is composed of a pair of electrode parts which may be referred to as electrode pairs. Thus, the bipolar ESC electrode 119 is divided into two parts corresponding to halves of the electrode pairs which collectively have an outline similar to one of the substrate 1 so that the whole substrate 1 is stuck on the stage 111 by means of the bipolar ESC electrode 119. Although it is necessary to define a small channel or gap (e.g., about 0.5-3 mm) between the electrode parts, such a small gap merely gives a trivial impact on the electrostatic chuck of the substrate 1. Also, the small gap has an area giving no adverse effect. Therefore, the bipolar ESC electrode 119 is designed taking consideration into an imaginary minimum outline that surrounds the electrode parts with the gap therebetween. Preferably the minimum outline has a size equal to or greater than that of the substrate 1. More preferably, the minimum outline has the size greater than that of the substrate 1 and also the outer edge 119E is positioned in the region between the outer edge of the substrate 1 and the outer edge 2Eout of the frame 2 set on the stage 111 (cf. FIG. 5).

The minimum outline preferably has a shape similar to that of the substrate 1. For example, when the substrate is circular, the semi-circular electrode pairs 119A, 119B are used to define the bipolar ESC electrode 119 as illustrated in FIG. 5. This allows in the bipolar mode, the whole substrate 1 to be electrostatically chucked on the stage 111 in a stable manner. Also in this instance, the electrode pairs 119A, 119B are provided with the first windows 119W, each of which size and shape are those as described above.

The ESC electrode 119 has the size and shape corresponding to those of the substrate 1 as mentioned above, so that the determination accuracy for the contact status can be assured even when the gas through-holes 210 are positioned close to the outer edge of the substrate 1 rather than beneath the substrate 1. This is because the substrate 1 is stuck across an almost whole surface thereof with a strong sticking force. This strong sticking force supplements the reduction of the force due to arrangement of the first windows 119W. On the other hand, the comb electrode that is conventionally used have a substantial large gap between the electrode pairs, which tend to reduce the sticking force. Therefore, it is likely more difficult with the comb electrode to accurately determine the contact status when the determination gas is supplied from the position near the outer edge of the substrate 1.

[Second Electrode] The second electrode 120 is preferably arranged within the stage 111. In the plasma etching step, when the second electrode 120 is supplied with the high-frequency power, a biasing potential is applied in the vacuum chamber 103. This results in the ion particles contained in the plasma atmosphere P2 being accelerated and impinging on the substrate 1, thereby increasing the etching rate.

To make the ion particles evenly impinging on the substrate 1, the second electrode 120 is also preferably arranged in a region at least corresponding to the substrate 1. The size of the ESC electrode 119 is preferably equal to or greater than the substrate 1, and more preferably greater than the substrate 1. On the other hand, the outer edge 120E of the second electrode 120 is preferably positioned in a region corresponding to one between the outer edge 2Eout of the frame 2 set on the stage 111 and the outer edge 1E of the substrate 1 (see FIG. 6). This allows the second electrode 120 arranged without interfering the supporting members 122 that drives the frame 2 upward and downward, thereby to prevent the second electrode 120 from being damaged due to the lifting motion of the frame 2.

In this case, the second electrode 120 is provided with a plurality of second windows 120W at positions corresponding to the gas through-holes 210 as illustrated in FIG. 5. Preferably the size of each of the second windows 120W is small but substantial enough to uncover the gas through-hole 210, thereby to facilitate the ion particles evenly impinging on the substrate 1. On the other hand, it is also preferable that the size of each of the second windows 120W is large but modest enough to secure the electrical insulation between the ESC electrode 119 and the second electrode 120, thereby to prevent insulation breakdown therebetween. Therefore, the size of each of the second windows 120W may be corresponding to or the same as that of each of the first windows 119W. Also, the shape of each of the second windows 120W may be similar to that of each of the first windows 119W.

To increase the ion particles impinging on the substrate 1, preferably the size of each of the second windows 120W is not overly large relative to the substrate 1. For example, the outer edge 120E of the second electrode 120 is positioned closer to the outer edge 1E of the substrate 1 than the inner edge 2Eout of the frame 2. The second electrode 120 shown in FIG. 6 is provided with a plurality of cut-outs at the outer edge to uncover the gas through-holes 210 and ensure the electrical insulation between the second electrode 120 and the ESC electrode 119.

[Plasma Processing Method] A plasma processing method of the present embodiment includes a setting step for setting the holding sheet with the substrate 1 on the stage provided within the plasma processing apparatus, a securing step for securing the holding sheet on the stage, after the securing step, a determination step for determining the contact status of the holding sheet on the stage, when the contact status is determined as acceptable (good) during the determination step, and a plasma etching step for etching the substrate on the stage by exposing the surface of the substrate to the plasma atmosphere P2. According to this plasma processing method, since the plasma treatment is implemented after determining the contact status between the substrate (with the holding sheet therebetween) and the stage as being acceptable, the poor plasma treatment is avoided so as to improve the production yield of the semiconductor chips.

Figure 7:
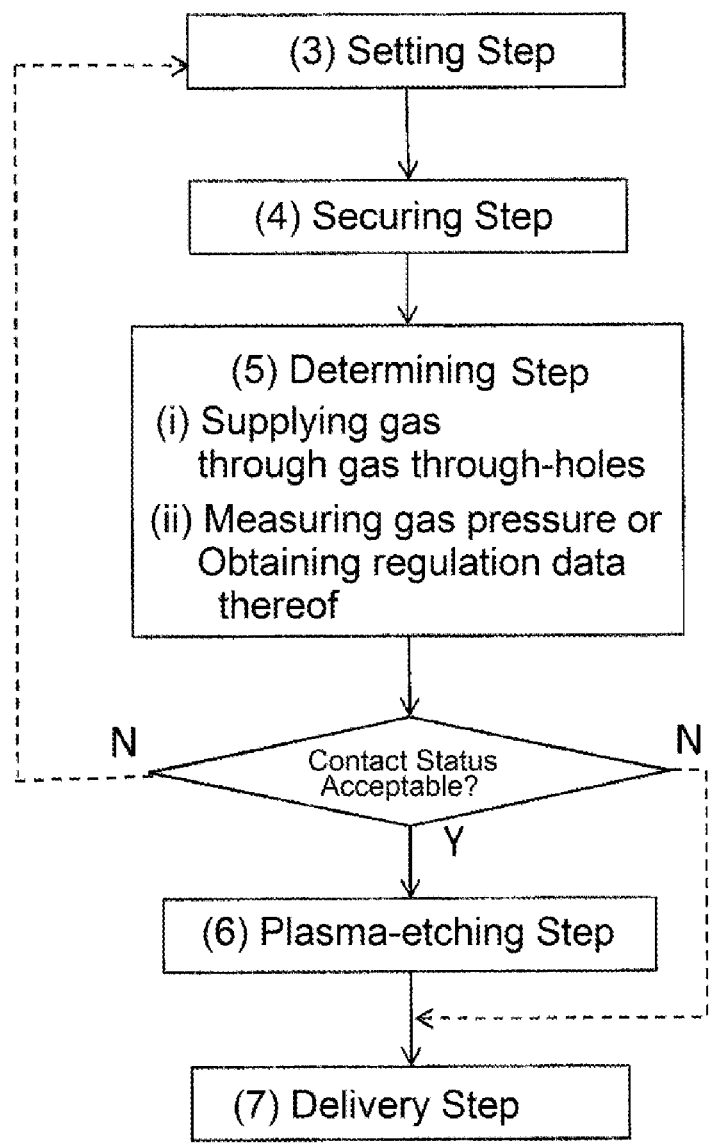
FIG. 7 is a flowchart depicting some steps of the plasma processing method according to an embodiment of the present invention.

Referring to FIGS. 7, 8A-8C through 12A-12C, the plasma processing method of the present embodiment will be described hereinafter. FIG. 7 is a flowchart illustrating some steps of the plasma processing method of the present embodiment. FIGS. 8A-8C through 12A-12C are charts illustrating the determination step for determining whether or not the contact status of the holding sheet on the stage 111 is acceptable (good).

[(1) Preparation Step] At the beginning, the conveying carrier 10 is prepared. The conveying carrier 10 is obtained by making the holding sheet 3 adhered on one side of the frame 2, while the adhesive side 3a of the holding sheet 3 is set so that it faces up to the frame 2 as illustrated in FIG. 1B. Then the substrate 1 is adhered on the adhesive side 3a of the holding sheet 3 so that the substrate 1 is held on the conveying carrier 10.

[(2) Delivery Step] Next, the conveying carrier 10 holding the substrate 1 is delivered into the vacuum chamber 103. In the vacuum chamber 103, the cover 124 is raised at a given level by means of the lifting rods 121. The conveying carrier 10 is delivered or loaded from a load-lock chamber (not shown) to the vacuum chamber 103. A plurality of the supporting members 122 are kept at the raised position. When the conveying carrier 10 is delivered to a given position above the stage 111, it is passed onto the supporting members 122. The conveying carrier 10 is seated on the top end of the supporting members 122, so that the side of the holding sheet 3 with the substrate 1 faces upward.

[(3) Setting Step] After the conveying carrier 10 is passed onto the supporting members 122, the vacuum chamber 103 is closed in a hermetically sealed condition, and the supporting members 122 are lowered. When the top ends of the supporting members 122 are lowered to the same level as the stage 111, the conveying carrier 10 is set on the stage 111. Then the lifting rods 121 are driven to lower the cover 124 to a predetermined level. The distance or gap between the cover 124 and the stage 111 is adjusted so that the biasing member 107 provided on the cover 124 achieves a point contact with the frame 2. Thus, the frame 2 is pushed down by the biasing member 107, and the cover 124 covers the frame 2 and a region of the holding sheet 3 outside the outer edge of the substrate 1 so that the substrate 1 is exposed by a third window of the cover 124.

The cover 124 is, for example, doughnut-shaped having a substantial circular outline, and a having a constant width and thickness. The inner diameter of the cover 124 (i.e., a diameter of the third window 124) is smaller than the inner diameter of the frame 2, and the outer diameter of the cover 124 is greater than the outer diameter of the frame 2. Therefore, when the conveying carrier 10 is set on the stage at a predetermined position and the cover 124 is lowered, the cover 124 overlaps the frame 2 and at least a partial region of the holding sheet 3. Also, at least a portion of the substrate 1 is exposed by the third window 124W. The cover 124 may be made of material, including for example, a ceramic such as alumina and aluminum nitride (AlN), a dielectric such as quarts, and a metal such as aluminum with/without an anodic oxidation coating. The biasing member 107 may be made of resin material, besides the aforementioned dielectric and metal.

In the securing step, the holding sheet 10 held on the stage 111 is secured or stuck on the stage 111. When the stage 111 is provided with the ESC electrode 119, the ESC electrode 119 is applied with the voltage to generate the sticking force between the holding sheet 3 of the conveying carrier 10 and the stage 111, thereby to secure the holding sheet 3 and the conveying carrier 10 on the stage 111.

When using the monopolar ESC electrode 119 or the bipolar ESC electrode 119 in the monopolar mode, the plasma atmosphere P1 for sticking the conveying carrier 10 on the stage 111 is generated by the input power preferably less than that for generating the plasma atmosphere P2 in the plasma etching step. This is to reduce the damage on the conveying carrier 10 caused by the plasma atmosphere. Also, for the same reason, the high-frequency power for generating the plasma atmosphere P1 is applied only to the first electrode 109, and not to the second electrode 120. Furthermore, the gas supplied within the vacuum chamber 103 for generating the plasma atmosphere P1 is preferably a gas which unlikely etches the conveying carrier 10 and the substrate 1. As example of the gas, argon, nitrogen, and helium may be listed. The plasma atmosphere P1 may be generated preferably after the setting step, i.e., when the conveying carrier 10 is set on the stage 111. Also, the plasma atmosphere P1 may be generated any time after the delivery step before the conveying carrier 10 is set on the stage 111.

When using the bipolar ESC electrode 119 in the bipolar mode, the ESC electrode 119 is applied with the voltage from the DC power 126 after the conveying carrier 10 is handed onto the supporting members 122. This allows the holding sheet 3 stuck on the stage 111 immediately after the holding sheet contacts the stage 111. Alternatively, the voltage application to the ESC electrode 119 may be initiated after the holding sheet 3 is set on (or contact) the stage 111.

[(5) Determination Step] In the determination step, the contact status is determined in accordance with the gas pressure itself or the regulation data for regulating the gas pressure. More specifically, the contact status between the stage 111 and the holding sheet 3 (or the substrate 1) is determined as acceptable or unacceptable (good or poor) by checking whether the gas pressure reaches to a prescribed value within a prescribed time period after introducing the gas between the stage 111 and the holding sheet 3. Alternatively, the contact status between the stage 111 and the holding sheet 3 (or the substrate 1) may be determined in accidence with the regulation data for regulating the gas pressure when introducing the gas between the stage 111 and the holding sheet 3. FIGS. 8B and 8C are charts showing the case where the contact status is determined as being acceptable (good). FIGS. 9B and 9C and FIGS. 10B and 10C are charts showing the cases where the contact status is determined as being unacceptable (poor).

Figure 8A:
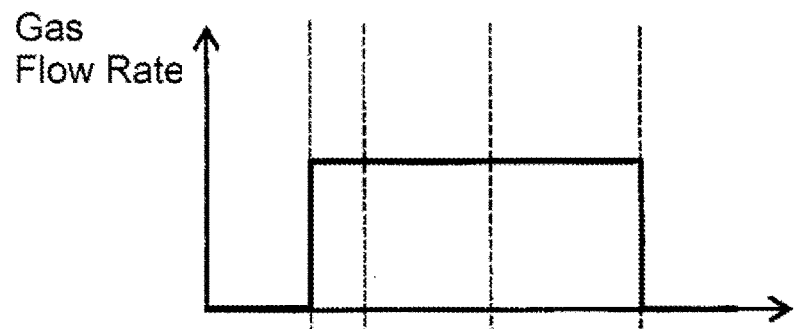
FIGS. 8A-8C are charts showing that a contact status between the substrate through the holding sheet and the stage is deemed as being acceptable (good) in the determining step.
Figure 8B:
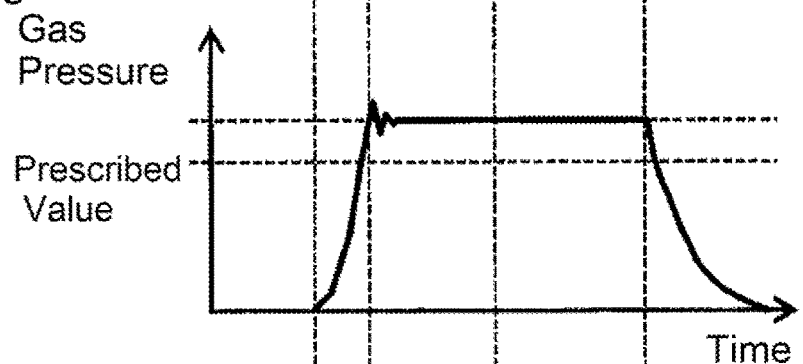
Figure 8C:
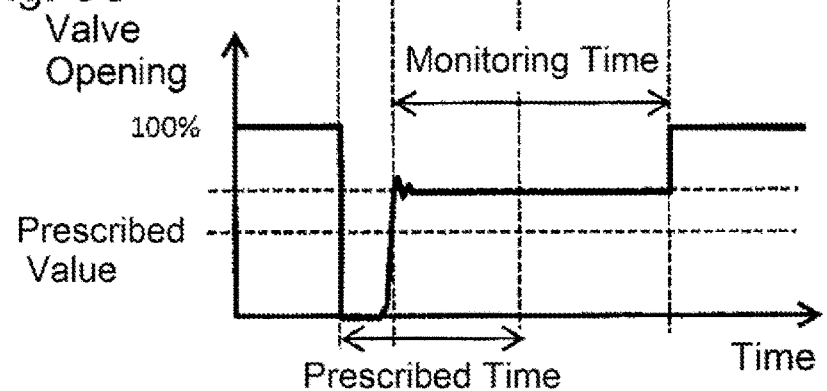

In the determination step, as illustrated in FIG. 8A, the gas is introduced into the gas introduction conduit 211 at a predetermined flow rate. The contact status between the holding sheet 3 (or the substrate 1) and the stage 111 is determined as being acceptable if the gas pressure reaches to the prescribed value within the prescribed time period after initiating the gas introduction into the gas introduction conduit 211 (cf. FIG. 8B). This is because as the holding sheet 3 is well hermetically sealed, and the gas leakage through the gap between the holding sheet 3 and the stage 111 is minimized.

To determine the contact status, the regulation data for regulating the gas pressure may be used (cf. FIG. 8C). The regulation data may contain data relating to an opening of the pressure regulating valve 214 and/or a stability of the valve opening. When using the opening of the pressure regulating valve 214, for example, a prescribed value of the opening of the pressure regulating valve 214 for regulating the gas pressure within the gas introduction conduit 211 at the given value is also defined, and then the contact status may be determined as being acceptable if the opening of the pressure regulating valve 214 exceeds the prescribed value. When using the data relating for the stability of the opening of the pressure regulating valve 214, for example, a prescribed monitoring time period is defined and the valve opening of the pressure regulating valve 214 is regulated at or above the prescribed value, then the contact status may be determined as being acceptable if the valve opening is maintained greater than the prescribed value until the prescribed monitoring time period has passed.

Figure 9A:
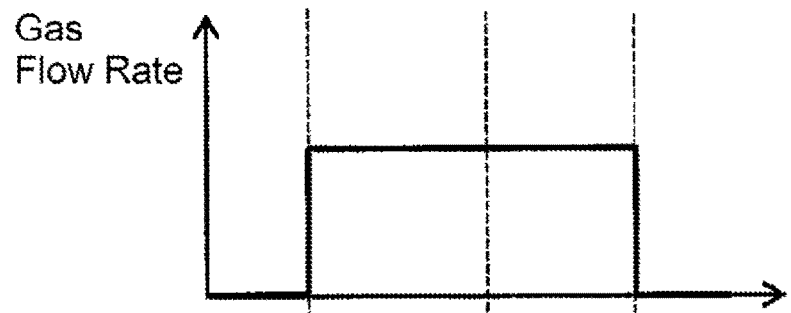
FIGS. 9A-9C are charts showing that the contact status between the substrate and the stage is deemed as being unacceptable (poor) in the determining step.
Figure 9B:
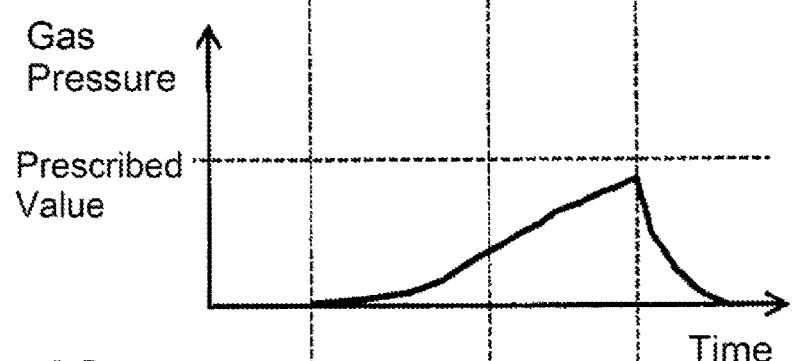

On the other hand, as illustrated in FIGS. 9A-9B, even though the gas is introduced into the gas introduction conduit 211 at a given flow rate (FIG. 9A), if the gas pressure fails to reach to the prescribed value within the prescribed time period after initiating the gas introduction into the gas introduction conduit 211 (cf. FIG. 9B), then the contact status is determined as being unacceptable. This is because the determination gas is deemed to leak through the gap between the holding sheet 3 and the stage 111. In this case, the valve opening of the pressure regulating valve 214 for regulating the gas pressure within the gas introduction conduit 211 at the given value fails to exceed the prescribed value within the prescribed time period.

Figure 9C:
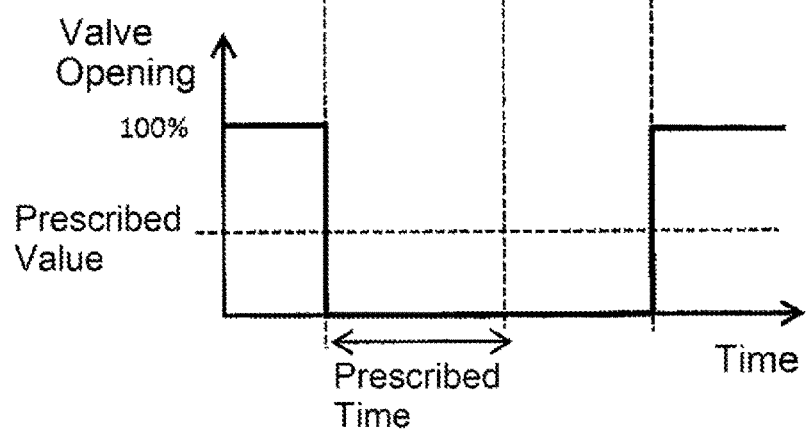
Figure 10A:
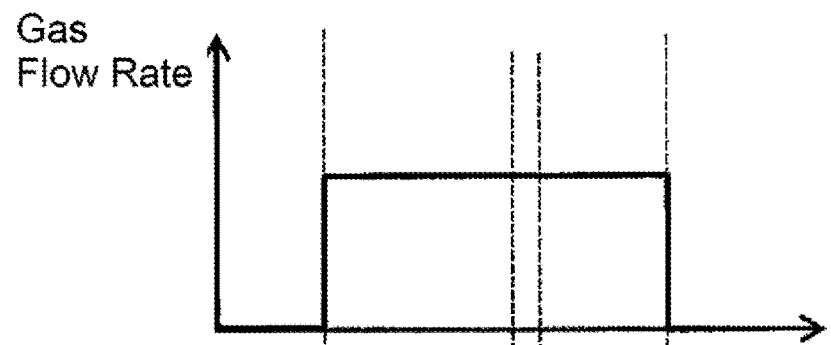
FIGS. 10A-10C are charts showing that the contact status between the substrate and the stage is deemed as being unacceptable (poor) in the determining step.
Figure 10B:
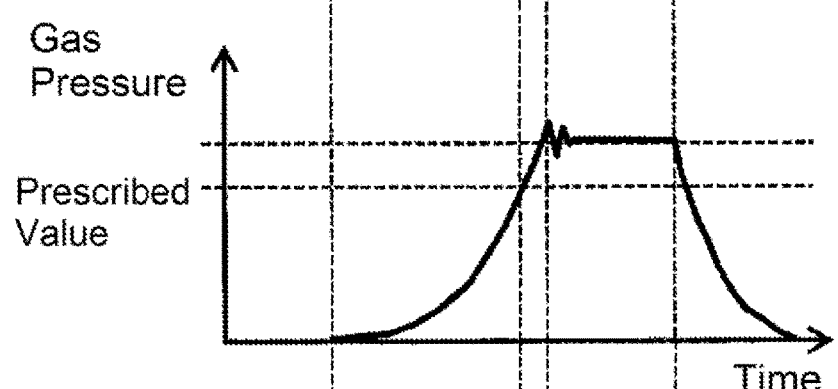
Figure 10C:
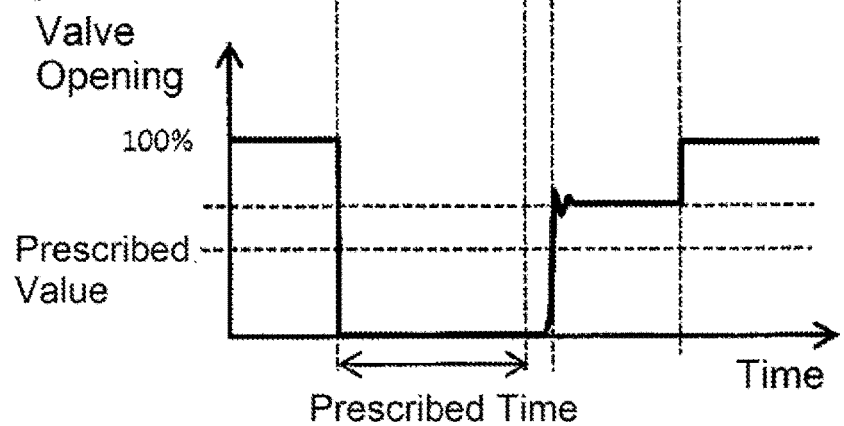

FIGS. 9B and 9C illustrate the case where the gas leakage is substantial. In another case where the gas leakage is moderate, FIGS. 10B and 10C illustrate the gas pressure in the gas introduction conduit 211 and the valve opening of the pressure regulating valve 214. FIG. 10A illustrates the given flow rate of the gas being introduced into the gas introduction conduit 211. FIG. 10B illustrates that the gas pressure takes a time period exceeding the prescribed time period to reach the prescribed value thereof. Also, FIG. 10C illustrates that the valve opening of the pressure regulating valve 214 takes a time period exceeding the prescribed time period to reach the prescribed value thereof.

Figure 11A:
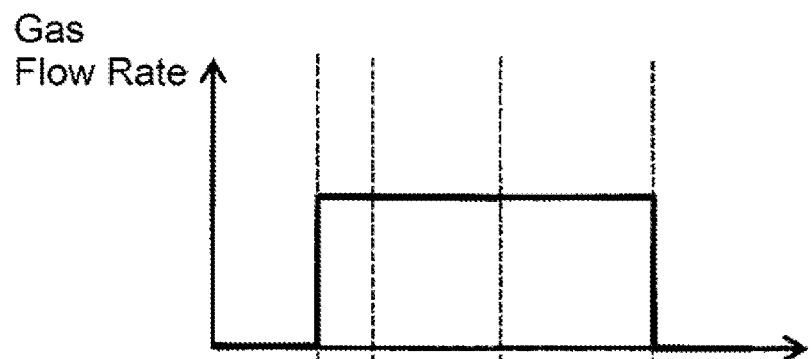
FIGS. 11A-11C are charts showing that the contact status between the substrate and the stage is deemed as being unacceptable (poor) in the determining step.
Figure 11B:
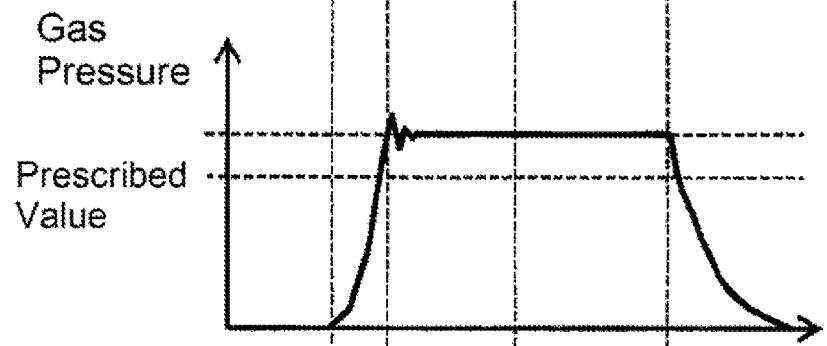
Figure 11C:
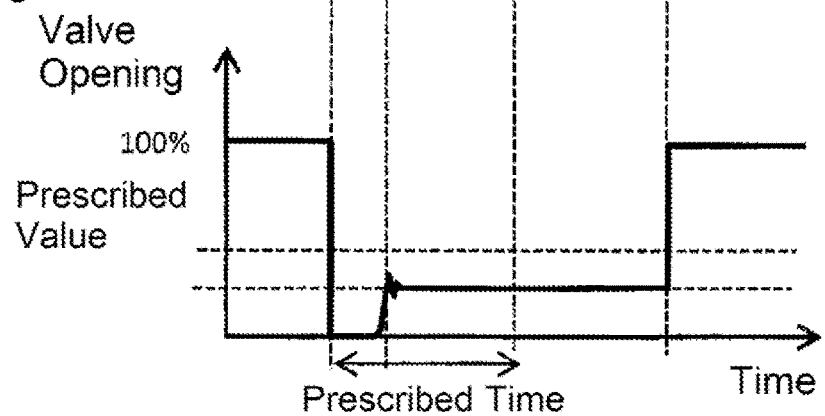

When using the valve opening of the pressure regulating valve 214 for determining the contact status, it may be determined as described below with reference to FIGS. 11A-11C. For example, the contact status may be determined as being unacceptable if while the gas is introduced into the gas introduction conduit 211 at a given flow rate, the gas reaches to the prescribed value within the given time period (cf. FIG. 11B) but the valve opening fails to reach to the prescribed value (cf. FIG. 11C).

Figure 12A:
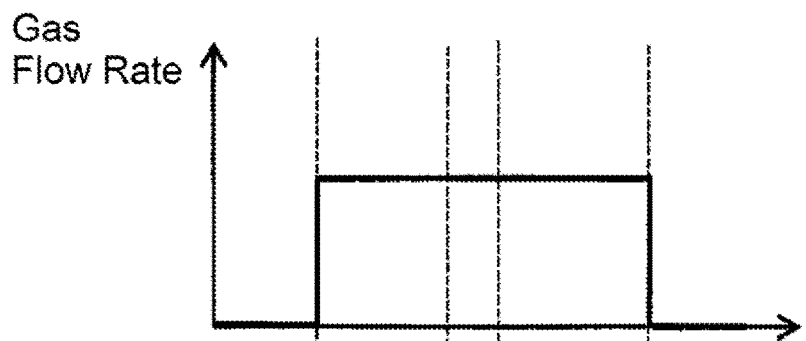
FIGS. 12A-12C are charts showing that the contact status between the substrate and the stage is deemed as being unacceptable (poor) in the determining step.
Figure 12B:
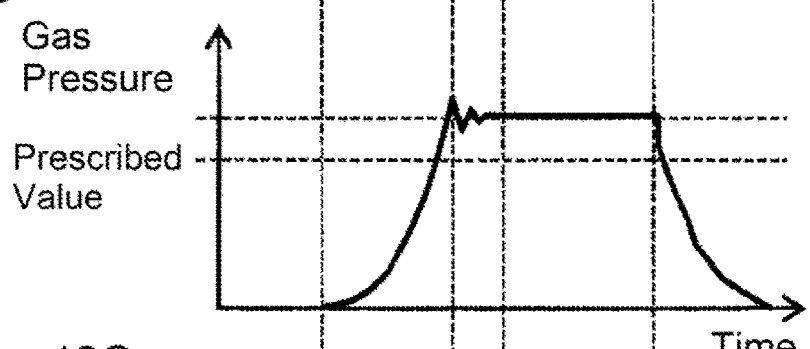
Figure 12C:
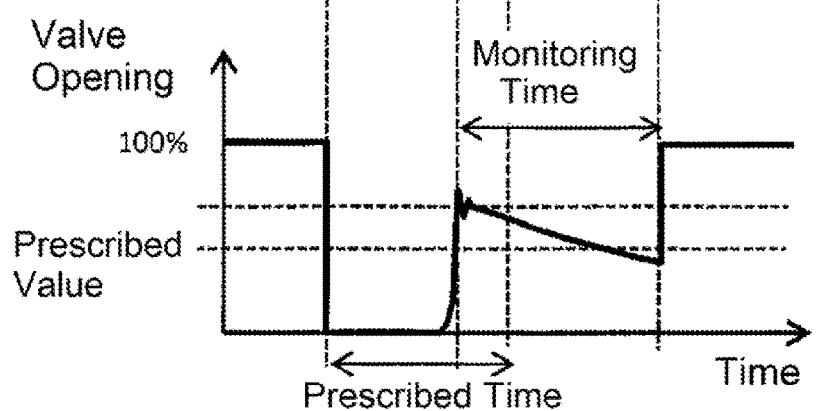

When defining the monitoring time period of the valve opening of the pressure regulating valve 214 and using the valve opening within the monitoring time period for determining the contact status, it may be determined as described below with reference to FIGS. 12A-12C. For example, the contact status may be determined as being unacceptable if while the gas is introduced into the gas introduction conduit 211 at a given flow rate, the gas reaches to the prescribed value within the given time period (cf. FIG. 12B) but the valve opening drops beyond the prescribed value within the monitoring time period (cf. FIG. 12C). It should be noted that the gas pressure and the valve opening shown in FIGS. 11A-11C and FIGS. 12A-12C are more likely detected when the gas leakage is less than that with the gas pressure and the valve opening as shown in FIGS. 9A-9C and FIGS. 10A-10C.

When the plasma etching step is implemented after the determination step, preferably the bypass valve 215 is opened to exhaust the gas left in the gas introduction conduit 211 after the e determination step. The substrate 1 is easily warped when the electrostatic chucking force for sticking the holding sheet 3 onto the stage 111 is less substantial and/or the substrate 1 gets thinner as the plasma etching step is ongoing. Thus, when the plasma etching step is implemented with the gas left in the gas introduction conduit 211, the residual gas pressure may cause a portion of the substrate 1 together with the holding sheet 3 positioned around the gas through-holes 210 raised or floated from the stage 111. The portion of the substrate 1 floated from the stage 111 tends to lead some problems such as an irregular processing shape and an abnormal discharge. Also, it disturbs the close contact between the holding sheet 3 and stage 111, which makes it difficult to cool down the holding sheet 3 in a sufficient manner.

[(6) Plasma Etching Step] When the contact status between the substrate 1 and the stage 111 is determined as being acceptable, the plasma etching step will follow. On the other hand, when the contact status between the substrate 1 and the stage 111 is determined as being unacceptable, the conveying carrier 10 is taken out from the vacuum chamber 103, or the supporting members 122 are lifted and the conveying carrier 10 is moved away from stage 111, and then the setting step is again performed. In retrying the setting step, that is when the supporting members 122 are moved upward and downward, they may be given a small oscillation upward and downward to facilitate removing the warp from the holding sheet 3.

In the plasma etching step, a processing gas is introduced from a processing gas source 112 through a gas inlet 103a into the vacuum chamber 103. On the other hand, a decompressing mechanism 114 is used for evacuating the gas within the vacuum chamber 103 to maintain the pressure therein at a constant pressure. Then, the first electrode 109 is supplied with the high-frequency power from the high-frequency power source 110A to generate the plasma atmosphere P2 within the vacuum chamber 103. The plasma atmosphere P2 is comprised of ions, electrons, and free radicals. The substrate 1 is removed or etched by a physicochemical reaction with the plasma atmosphere P2, from a top surface through a bottom surface in a region uncovered by a resist layer formed thereon so that the substrate 1 is individualized or separated into a plurality of dices.

At this time, the second electrode 120 may be supplied with the high-frequency power having a high frequency of 100 kHz or more, from the second high-frequency power source 110B. The energy of the ions impinging to the substrate 1 may be controlled by the high-frequency power supplied to the second electrode 120 from the second high-frequency power source 110B. The high-frequency power supplied to the second electrode 120 defines the biasing potential on the surface of the stage 111, which in turn accelerates the impinging ions towards the substrate 1, thereby to increase the etching rate.

The etching conditions may be selected appropriately in accordance with the material of the substrate 1, for example. In a case that the substrate 1 is made of silicon (Si) for example, the substrate 1 may be etched by generating the plasma atmosphere P2 in the vacuum chamber 103 with a source material of sulfur hexafluoride ($SF_6$). For example, the vacuum chamber 103 may be supplied with the source gas of $SF_6$ at a flow rate of 100-800 sccm so that the pressure therein is controlled between 10-50 Pa. Also, the first electrode 109 may be supplied with the high-frequency power having the power between 1000-5000 W and the high frequency of 13.56 MHz or more, and the second electrode 120 may be supplied with the high-frequency power having the power between 50-1000 W and the high frequency of 100 kHz or more (for example, between 400-500 kHz, or 13.56 MHz).

A coolant circulation device 125 may preferably be used for cooling down the conveying carrier 10 while being etched, by means of a coolant circulating within the stage 111 of which temperature is set between −20 and +20 degrees Celsius. If the contact status between the holding sheet 3 and the stage 111 is well or acceptable, the temperature of the holding sheet 3 during the plasma treatment is controlled less than 60 degrees Celsius, for example, so that the holding sheet 3 is protected from the thermal damage.

For the plasma dicing process, the surface of the substrate 1 uncovered by the resist mask may preferably be etched along a vertical direction. In this case, two plasma processing steps may be alternately repeated, including the plasma etching step with the fluorine-based source gas such as sulfur hexafluoride ($SF_6$) as mentioned above, and a protective-layer depositing step for depositing a protective layer with the fluorocarbon source gas such as perfluorocyclobutane ($C_4F_8$)

After individualizing the substrate 1 into the dices by the etching, an ashing step is performed. A processing gas used for the ashing step (for example, oxygen gas or mixed gas including oxygen gas and gas containing fluorine) is introduced from a ashing gas source 113 into the vacuum chamber 103. On the other hand, the decompressing mechanism 114 is used to evacuate the gas from the vacuum chamber 103 to maintain the pressure therein at a predetermined level. The high-frequency power is supplied from the first high-frequency power source 110A to generate the oxygen plasma atmosphere within the vacuum chamber 103, so that the resist mask is thoroughly removed from the surface of the individualized substrate 1 (electronic components) in the region exposed through the third window 124W by the cover 124.

[(7) Delivery Step] After completing the ashing step, the gas in the vacuum chamber 103 is evacuated. The conveying carrier 10 holding the individualized substrate 1 is unloaded from the plasma processing apparatus 100. After the conveying carrier 10 is unloaded, the vacuum chamber 103 is again closed in a hermetically sealed condition. The unloading step of the conveying carrier 10 may be performed by a procedure opposite to the aforementioned loading or delivery step. Thus, the cover 124 is lifted up to the given position, the power supply to the ESC electrode 119 is cut off to release the conveying carrier 10 from the stage 111, and then the supporting members 122 are moved upward. After the supporting members 122 are moved up to the given level, the conveying carrier 10 is unloaded from the vacuum chamber 103.

REFERENCE NUMERALS

1: substrate, 1E:outer edge of substrate, 2: frame, 2a: notch, 2b: corner cut, 2Ein: inner edge of frame, 2Eout: outer edge of frame, 3: holding sheet, 3a: adhesive side, 3b: non-adhesive side, 10: conveying carrier, 100: plasma processing apparatus, 103: vacuum chamber, 103a: gas inlet, 103b: gas outlet, 107: biasing member, 108: dielectric member, 110A: first high-frequency power source, 110B: second high-frequency power source, 111: stage, 112: processing gas source, 113: ashing gas source, 114: decompressing mechanism, 115: electrode layer, 116: metal layer, 117: base member, 118: peripheral member, 119: ESC electrode, 119A, 119B: semi-circular electrode pairs, 119E: outer edge of ESC electrode, 119W: first window, 120: second electrode, 120E: outer edge of second electrode, 120W: second window, 121: lifting rod, 122: supporting member, 123A, 123B: lifting mechanism, 124: cover, 124W: third window, 125: coolant circulation device, 126: DC power, 127: coolant channel, 128: controller, 129: circumferential ring, 210: gas through-hole, 211: gas introduction conduit, 212: manometer, 213: mass flow controller, 214: pressure regulating valve, 215: bypass valve, 216: gas source for determination, 217: automatic pressure regulator, 217a: manometer, 217b: piezo-valve, 217c: flowmeter, 218: orifice

What is claimed is:

1. A plasma processing apparatus, comprising:
   a chamber:
   a stage provided inside the chamber and configured to set a holding sheet and a substrate held thereon, the holding sheet having a circumference secured on a frame;
   a securing mechanism configured to secure the holding sheet on the stage;
   a plasma generator including a first electrode and a first high-frequency power supply for supplying a high-frequency power to the first electrode; and a determiner for determining a contact status between the holding sheet and the stage;

wherein a gas through-hole connected to a gas introduction conduit is arranged on a surface of the stage in an annular region defined between an inner edge of the frame set on the stage and an outer edge of the substrate, and wherein the determiner is configured to determine the contact status in accordance with at least one of a pressure of a gas in the gas introduction conduit and a regulation data for regulating the pressure of the gas in the gas introduction conduit, the gas being introduced between the stage and the holding sheet from the gas through-hole through the gas introduction conduit.

2. The plasma processing apparatus according to claim 1, wherein the gas through-hole is arranged closer to the outer edge of the substrate than the inner edge of the frame in the annular region.

3. The plasma processing apparatus according to claim 1,
wherein the securing mechanism is an electrostatic chucking mechanism provided in the stage, and includes a pair of semi-circular electrodes, and wherein each of the semi-circular electrodes has an arc portion arranged between the outer edge of the frame set on the stage and the outer edge of the substrate, and a first window arranged at a position corresponding to the gas through-hole.

4. The plasma processing apparatus according to claim 1, further comprising:
a bias-potential generator including a second electrode provided in the stage and a second high-frequency power supply for supplying a high-frequency power to the second electrode, wherein the second electrode has an outer edge arranged between the outer edge of the frame set on the stage and the outer edge of the substrate, and a second window arranged at a position corresponding to the gas through-hole.

5. A plasma processing method, comprising:
a setting step for setting a holding sheet on a stage provided in a plasma processing apparatus, the holding sheet having a circumference secured on a frame;

a securing step for securing the holding sheet on the stage;
a determining step for determining a contact status between the holding sheet and the stage; and
a plasma etching step for etching the substrate on the stage by exposing a surface of the substrate to a plasma atmosphere upon determining the contact status as being acceptable, wherein a gas through-hole connected to a gas introduction conduit is arranged on a surface of the stage in an annular region defined between an inner edge of the frame set on the stage and an outer edge of the substrate, and wherein in the determining step, a gas is introduced between the stage and the holding sheet from the gas through-hole through the gas introduction conduit, and the contact status is determined in accordance with at least one of a pressure of the gas in the gas introduction conduit and a regulation data for regulating the pressure of the gas in the gas introduction conduit.

6. The plasma processing method according to claim 5, wherein the gas through-hole is arranged closer to the outer edge of the substrate than the inner edge of the frame in the annular region.

7. The plasma processing method according to claim 5,
wherein a pair of semi-circular electrodes are provided in the stage, each of the semi-circular electrodes having an arc portion arranged between the outer edge of the frame set on the stage and the outer edge of the substrate, and a first window arranged at a position corresponding to the gas through-hole, and wherein in the securing step, the holding sheet is secured on the stage by applying the semi-circular electrodes with a potential for generating a sticking force between the holding sheet and the stage.

8. The plasma processing method according to claim 5,
wherein a second electrode is provided in the stage, and
wherein the second electrode has an outer edge arranged between the outer edge of the frame set on the stage and the outer edge of the substrate, and a second window arranged at a position corresponding to the gas through-hole.

* * * * *